United States Patent [19]
Tojo et al.

[11] Patent Number: 4,808,002
[45] Date of Patent: Feb. 28, 1989

[54] METHOD AND DEVICE FOR ALIGNING FIRST AND SECOND OBJECTS RELATIVE TO EACH OTHER

[75] Inventors: Toru Tojo, Kanagawa; Mitsuo Tabata, Yokohama; Hisakazu Yoshino, Tokyo, all of Japan

[73] Assignees: Kabushiki Kaisha Toshiba, Kawasaki; Tokyo Kogaku Kikai Kabushiki Kaisha, Tokyo, both of Japan

[21] Appl. No.: 167,233

[22] Filed: Mar. 11, 1988

[30] Foreign Application Priority Data

Mar. 11, 1987 [JP] Japan .................................. 62-54123

[51] Int. Cl.$^4$ ............................................. G01B 11/00
[52] U.S. Cl. .................................................. 356/401
[58] Field of Search ....................... 356/399, 400, 401; 250/548, 557, 561

[56] References Cited

U.S. PATENT DOCUMENTS

| | | | |
|---|---|---|---|
| 4,568,189 | 2/1986 | Bass et al. | 356/401 |
| 4,643,579 | 2/1987 | Toriumi et al. | 356/401 |

FOREIGN PATENT DOCUMENTS 503362 1/1975 Japan .

OTHER PUBLICATIONS

Georges Dubroeucq, Michael Lacombat, David Sullerot; Double Diffraction Gratings as Keys for High Contrast Alignment on Wafer Steppers 1980, ME p. 181.

*Primary Examiner*—F. L. Evans
*Attorney, Agent, or Firm*—Oblon, Fisher, Spivak, McClelland & Maier

[57] ABSTRACT

First and second objects are moved relative and parallel to each other, in order to be aligned. More specifically, a first mark formed on the first object has first and second light-passing sections. A second mark formed on the second object has first and second light-reflecting sections. A light beam from a light source is directed to and reflected by the first and second light-reflecting sections of said second mark and transferred onto said first mark. An image of said first light-reflecting section is projected onto the first mark, so that the first light-passing section has a first overlapping region which overlaps a part of the inner of said first light-reflecting section. An image of said second light-reflecting section is projected onto the first mark, so that said second light-passing section has a second overlapping region which overlaps a part of the image of said second light-reflecting section. A first light beam passed through the first overlapping region and a second light beam passed through the second overlapping region are detected independently. The difference in amount between these two light beams is proportional to the positional shift between the objects. The objects are adjusted relative to each other to make the first and second light beams equal in amount, so that the objects can be aligned relative to each other. The first object is a reticle and the second object is a wafer or wafer table in the projecting and exposing apparatus.

19 Claims, 12 Drawing Sheets

METHOD AND DEVICE FOR ALIGNING FIRST AND SECOND OBJECTS RELATIVE TO EACH OTHER

BACKGROUND OF THE INVENTION

1. Field of the Invention

The present invention relates to a method of aligning first and second objects relative to each other and a device for the same, and more particularly, it relates to a method and device for aligning a mask (reticle) and a wafer relative to each other when the image of a circuit pattern is to be transferred onto the wafer in the course of manufacturing semiconductors, for example.

2. Description of the Related Art

Figure 1:
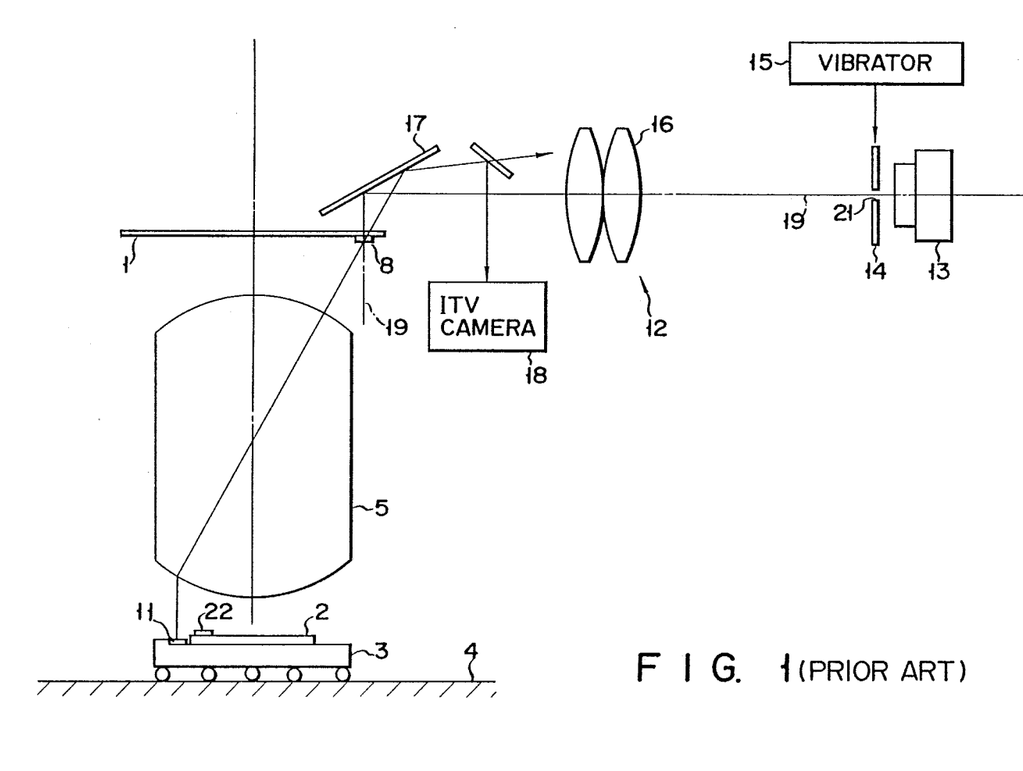
FIG. 1 is a diagram showing the aligning device according to the conventional technique.

The projecting and exposing apparatus used in the course of manufacturing semiconductors such as LSI includes a mask (reticle) on which a circuit pattern is previously formed and a wafer on which the image of this circuit pattern is transferred. As shown in FIG. 1, wafer 2 is mounted on wafer table 3, which is moved on base 4 by a driver means (not shown). Mask or reticle 1 is arranged above wafer 2. Projecting lens 5 is arranged between reticle 1 and wafer 2. When the circuit pattern previously formed on reticle 1 is irradiated by exposing light, therefore, the image of the circuit pattern is reduced and transferred on wafer 2 through projecting lens 5. It is needed before this transferring process that reticle 1 and wafer 2 are accurately aligned relative to each other.

This process of aligning the reticle and the wafer relative to each other includes a first step (reticle alignment) of aligning reticle 1 and wafer table 3 relative to each other and a second step of aligning reticle 1 and wafer 2 relative to each other.

Figure 2A:
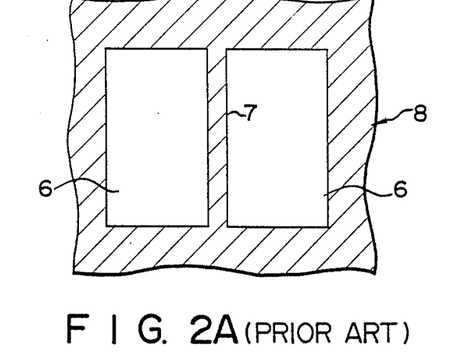
FIG. 2A is a plan showing a reticle mark employed by the aligning device in FIG. 1.
Figure 2B:
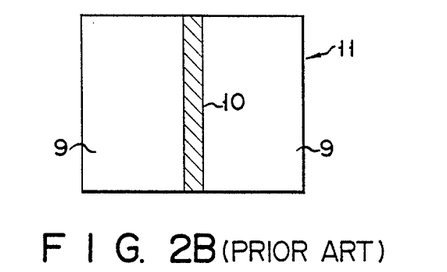
FIG. 2B is a plan showing a reference mark used by the aligning device in FIG. 1.

The first step will be described referring to FIGS. 1 through 4. This alignment includes rough and fine ones. A mark and an ITV camera are used for the rough alignment. A mark and an observation optical system are used for the fine alignment. As shown in FIG. 2A, reticle 1 is provided with mask or reticle mark 8 having two windows 6 and bar 7. As shown in FIG. 2B, wafer table 3 is provided with reference mark 11 having two reflecting faces 9 and bar 10. Observation optical system 12 is located on one side of reticle 1, as shown in FIG. 1. This optical system 12 includes photo-sensor 13, vibration slit 14, vibrator 15, lenses 16, and mirror 17. Optical system 12 detects reticle and reference marks 8 and 11 according to the vibration slit method.

Figure 2C:
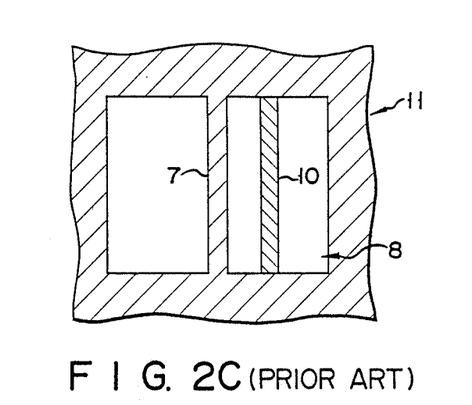
FIG. 2C is a plan showing the reticle mark overlapped upon the reference mark.

Reticle and reference marks 8 and 11 are observed by ITV camera 18 in the case of the rough alignment. Namely, images of bar 7 and bar 10 projected in window 6 are observed by ITV camera 18, as shown in FIG. 2C. Reticle 1 and wafer table 3 are moved and bars 7 and 10 are matched relative to reference line 19 of optical system 12, respectively. Reticle 1 and wafer table 3 are thus aligned relative to each other, as shown in FIG. 1.

Figure 3:
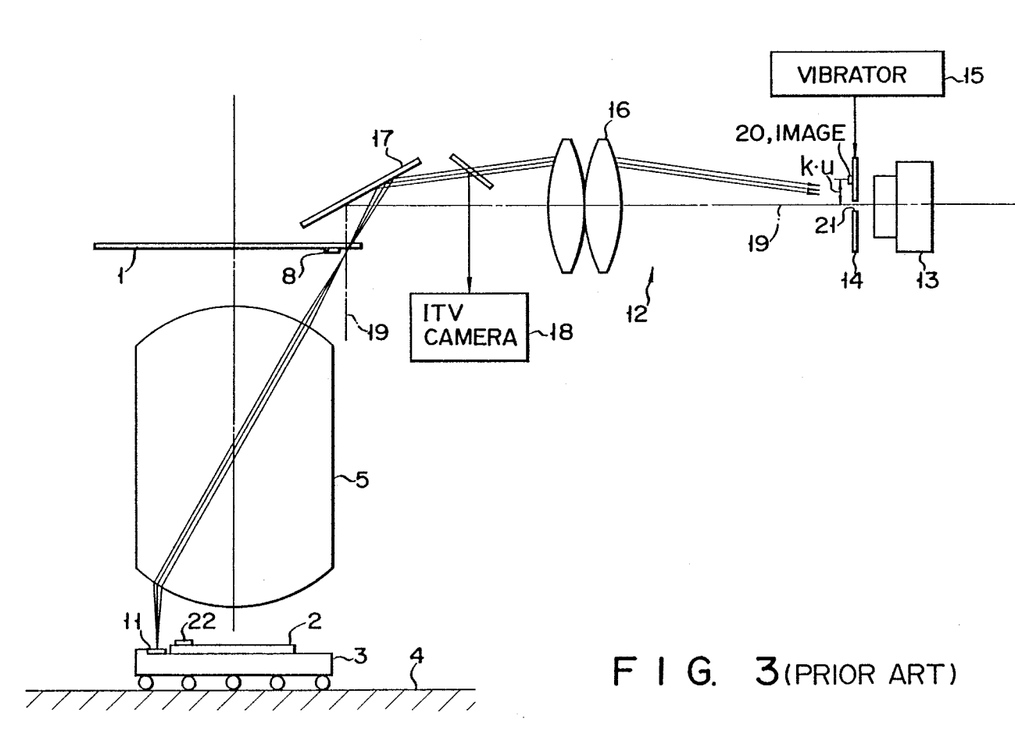
FIG. 3 shows the process of aligning the wafer table relative to the reference line and FIG. 4 shows the process of aligning the reticle relative to the reference line.
Figure 4:
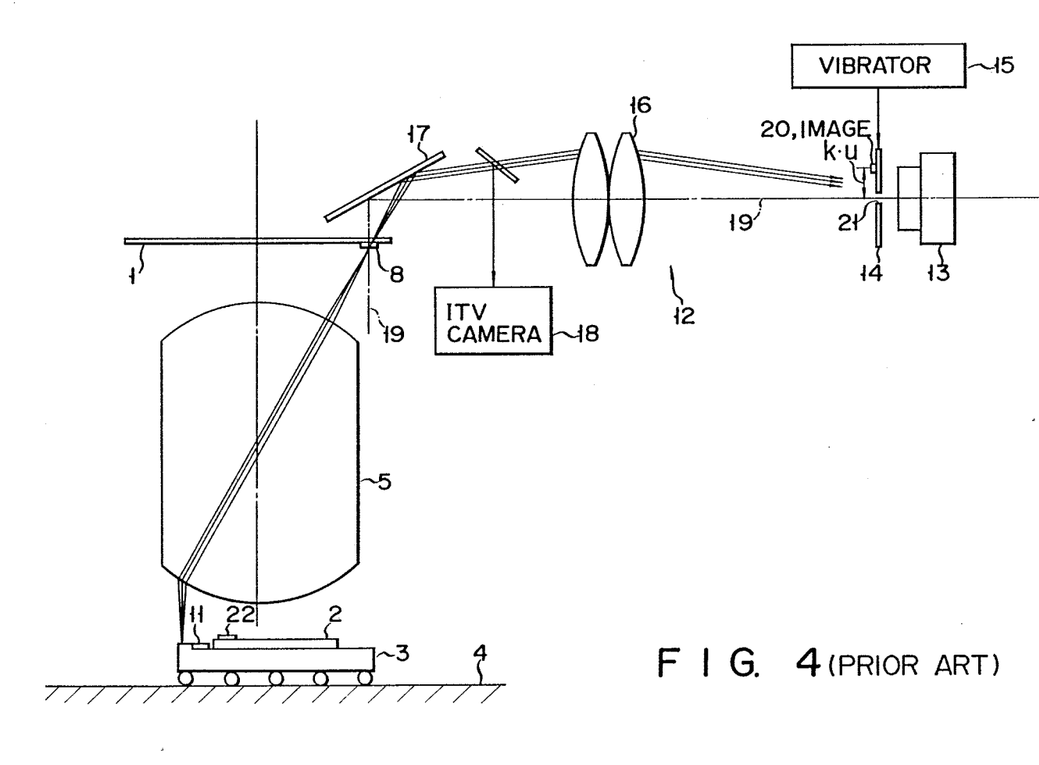

Reticle 1 and wafer table 3 are then minutely aligned relative to each other, as shown in FIGS. 3 and 4. Reticle 1 is temporarily moved left from its position where it is to be aligned, as shown in FIG. 3. Reference mark 11 is matched relative to reference line 19 of optical system 12. More specifically, when reference mark 11 is irradiated by light, the image of bar 10 of reference mark 11 is projected on vibration slit 14 via projector lens 15, mirror 17 and lens 18. When wafer table 3 is shifted by u in position, for example, image 20 of bar 10 is projected on a position which is separated from reference line 19 by k·u. Amount u of wafer table 3 shifted is therefore proportional to the distance k·u between image 20 of bar 10 and reference line 19. Vibration slit 14 is being vibrated at a certain frequency by vibrator 15, taking reference line 19 as its vibrating center. When the position of opening 21 of vibration slit 14 is in accordance with that of image 20 of bar 10, therefore, image 20 of bar 10 is entered into photo-sensor 13 through opening 21 of vibration slit 14. Distance k·u between image 20 of bar 10 and reference line 19 is calculated basing on signals of image 20 detected by photo-sensor 13 and certain frequency f. Amount u of wafer table 3 shifted is obtained from this distance k·u. Therefore, bar 10 of reference mark 11 is aligned relative to reference line 19, moving wafer table 3 to make this position-shifted amount u zero. Coordinates of reference mark 11 on wafer table 3 are read this time according to the laser interference manner.

Reticle mark 8 is then matched relative to reference line 19 of optical system 12, as shown in FIG. 4. Wafer table 3 is moved from that position where it is to be aligned, to thereby allow light, which is reflected by wafer table 3, to irradiate reticle mark 8. The light passed through reticle mark 8 is introduced to vibration slit 14 via mirror 17 and lenses 16. The image of bar 7 of reticle mark 8 is thus projected on vibration slit 14. Bar 7 and reference line 19 are therefore aligned relative to each other, similarly to the case where bar 10 of reference mark 11 is aligned relative to reference line 19. Wafer table 3 is then returned to that position where it is to be aligned, basing on read values of the coordinates of wafer table 3. Reticle 1 and wafer table 3 are thus aligned relative to each other, as shown in FIG. 1.

However, reference mark 11 and reference line 19 of optical system 12 are aligned relative to each other, reticle mark 8 and reference line 19 are then aligned relative to each other, and as the result, reticle 1 and wafer table 3 are aligned relative to each other, as described above. Therefore, the conventional method has two aligning processes, thereby becoming complicated in the alignment. Further, the alignment is achieved by two processes, thereby making it necessary to move the reticle and the wafer table in the course of alignment. The conventional method is therefore likely to cause error in the alignment.

When the voltage for vibrator 15 is changed by some reason, the vibrating center of vibration slit 14 is drifted. That is, reference line 19 is drifted. Error is therefore sometimes caused in aligning reticle 1 and wafer table 3 relative to each other.

Furthermore, it is needed that reference line 19 is arranged perpendicular to lenses 16 and the reticle mark, for the purpose of accurately projecting the images of bars 7 and 10 of reticle and reference marks 8 and 11 onto vibration slit 14 without causing any error in their magnification. In the case where lenses 16 are single-sided telecentric, therefore, luminous flux passed through reticle mark 8 is introduced to vibration slit 14, shifting from and passing above reference line 19. Namely, this luminous flux passes through the upper halves of lenses 16. It is therefore needed that lenses 16 and mirror 17 are made large in size. As the result, optical system 12 becomes large in size.

Still further, it is needed that the aberration of lenses 16 is corrected, in order that the luminous flux passed through reticle mark 8 can pass through the whole of lenses 16. This makes the arrangement of the lenses complicated.

The second process of aligning the reticle and the wafer relative to each other will be described.

Figure 5:
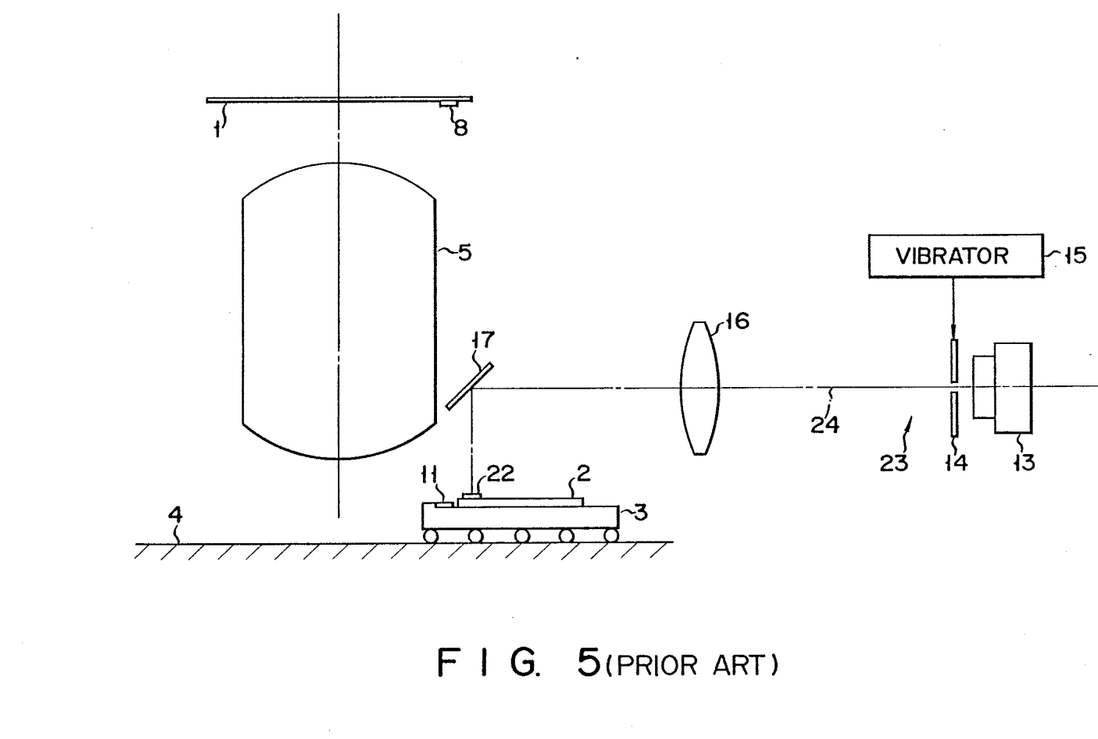
FIG. 5 is a diagram showing the aligning device according to the conventional technique in which the off-axis system is employed.

As shown in FIG. 5, wafer 2 is provided with wafer mark 22 similar to reference mark 11. However, reticle 1 and wafer 2 cannot be directly aligned relative to each other. Therefore, optical system 23 (or off-axis system) different from above-mentioned optical system 12 is located adjacent to one side of wafer table 3. Optical system 23 includes photosensor 13, vibration slit 14, vibrator 15 and the like, similarly to optical system 12. Wafer table 3 is moved and wafer mark 22 is matched relative to reference line 24 of optical system 23. Coordinates of wafer table 3 are read at this position. Wafer table 3 is then moved and reference mark 11 of wafer table 3 is matched relative to reference line 24 of optical system 23. Coordinates of wafer table 3 are read at this position. The positional relation between reference mark 11 and wafer mark 22 is thus obtained. When wafer table 3 is moved a certain distance, therefore, wafer mark 22 is aligned relative to reticle mark 8.

The alignment of the reticle and the wafer is carried out by two steps also in the second process. Therefore, error can be caused in the alignment. Similarly to optical system 12, the vibrating center of vibration slit 14 is drifted to thereby cause error in the alignment. Because the second process is carried out using the off-axis system in which the light detected is not passed through the projector lens, it is more likely to cause error in the alignment, as compared with the first process (or TTL system) in which the light detected is passed through the projector lens.

SUMMARY OF THE INVENTION

The object of the present invention is to provide a method capable of directly aligning first and second objects relative to each other and enhancing the accuracy of this alignment and to provide a device for the same.

In other words, the object of the present invention is to provide a method of aligning a mask and a wafer relative to each other, whereby those error in the alignment which are caused when the vibrating center of the vibration slit is drifted can be eliminated, and the mirror and the lenses in the optical system can be made smaller in size and simpler in arrangement so as to enhance the accuracy of aligning the mask and the wafer relative to each other. The object of the present invention is also to provide a device for the same.

According to the present invention, there is provided a method of moving first and second objects relative and parallel to each other to be aligned, comprising steps of forming a first mark on the first object, said first mark having first and second light passing sections; forming a second mark on the second object, said second mark having first and second light reflecting sections; directing a light beam, emitted from a light source, onto the first and second light reflecting sections of the second mark; transferring the light beam reflected by the first light reflecting section onto the first mark, thereby projecting an image of the first light reflecting section onto the first mark, and said first light passing section having a first overlapping region for overlapping a part of the image of the first light reflecting section; transferring the light beam reflected by the second light reflecting section, thereby projecting an image of the second light reflecting section onto the first mark, and said second light passing section having a second overlapping region for overlapping a part of the image of the second light reflecting section; detecting, independently of each other, first and second light beams passed through first and second overlapping regions, difference in amount between these two light beams being proportional to the positional shift between the first and the second object; and adjusting the first and second objects relative to each other to make the first and second light beams equal in amount, so that the first and second objects can be aligned relative to each other.

Difference in amount between the first and the second light beam is proportional to the positional shift between the first and the second object. The first and second objects are therefore adjusted relative to each other to make the first and second light beams equal in amount. According to the present invention, the distance between the reference line and the image of bar is not detected but two light beams are detected about their amounts to thereby achieve the alignment. Those errors in the alignment which are caused when the vibrating center of the vibration slit is drifted can be eliminated. Further, the aligning accuracy can be enhanced because the alignment is carried out only by one process. Furthermore, the lenses can be made smaller in size and simpler in arrangement because two light beams are detected about their amounts (effects of the present invention will be described later in detail).

BRIEF DESCRIPTION OF THE DRAWINGS

FIGS. 3 and 4 are diagrams showing the aligning device in FIG. 1, wherein

FIGS. 9 and 10 are sectional views showing the reticle and reference marks (with the projector lens omitted), wherein

DETAILED DESCRIPTION OF THE PREFERRED EMBODIMENTS

Figure 6:
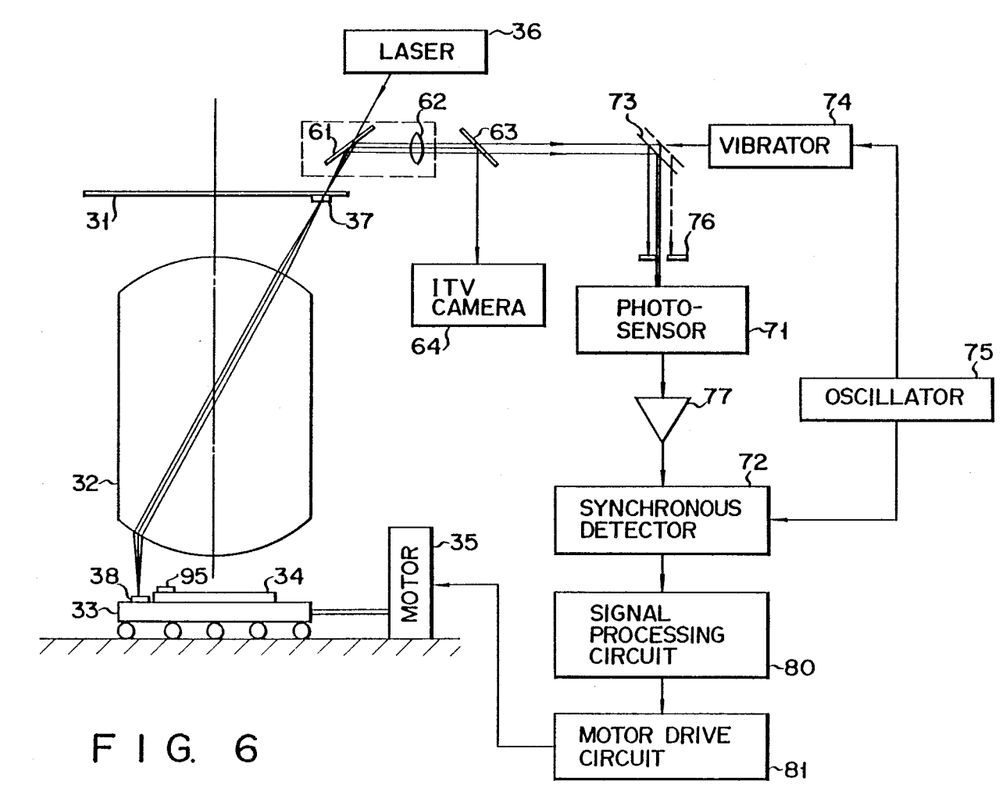
FIG. 6 is a diagram showing a device for aligning the reticle and the wafer table relative to each other according to the present invention.

FIG. 6 shows a part of the projecting and exposing apparatus employed in the course of manufacturing semiconductors, and a device for aligning a mask and a wafer relative to each other according to the present invention.

An IC circuit pattern (not shown) is formed on mask or reticle 31. Reducing and projecting lens 32 is arranged under reticle 31. Wafer table 33 is located under reducing and projecting lens 32. Wafer 34 which is coated with photoresist is mounted on wafer table 33. Wafer table 33 is mechanically connected to motor 35. When motor 35 is driven, wafer table 33 is moved in a predetermined direction. An exposing light source (not shown) is located above reticle 31. When the circuit pattern on reticle 31 is irradiated by light emitted from the exposing light source (not shown), therefore, the exposing light is introduced to wafer 34 via the circuit pattern and projecting lens 32. The image of the circuit pattern is thus reduced and projected onto the wafer. As the result, the photoresist on wafer 34 is exposed and the image of the circuit pattern is transferred onto wafer 34.

The alignment according to the present invention includes a first process of aligning reticle 31 and wafer table 33 relative to each other, and a second process of aligning reticle 31 and wafer 34 relative to each other. After reticle 31 and wafer table 33 are aligned relative to each other, the first time transferring of the circuit pattern is carried out and after reticle 31 and wafer 34 are aligned relative to each other, the second time transferring of the circuit pattern is carried out.

The first process will be described referring to FIGS. 6 through 11.

The aligning device will be roughly described at first. It includes reticle mark 37 on the underside of reticle 31 and reference mark 38 on the top of wafer table 34. It further includes laser 36 for emitting coherent light beam, a means for detecting the light beam to convert it to an electric signal, and a means for adjusting the position of wafer table 33 responsive to this electric signal. As shown in FIG. 6, therefore, light beam which is emitted from laser 36 or which has a wavelength equal to that of the exposing light is introduced to reference mark 38, passing through reticle mark 37 and projecting lens 32. The light beam reflected by reference mark 38 is introduced to reticle mark 37, passing through projecting lens 37 again. The image of reference mark 38 is projected onto reticle mark 37 this time. The light beam passed through reticle mark 38 is detected by the detector means and converted to a detecting or electric signal. The position of wafer table 33 is adjusted relative to reticle 31 by the position adjusting means. As the result, wafer table 33 is aligned relative to reticle 31.

Figure 7A:
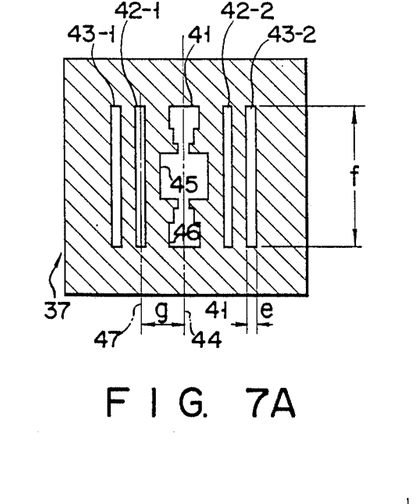
FIG. 7A is a plan showing a reticle mark according to the present invention.

As shown in FIG. 7A, reticle mark 37 includes vernier 41 formed in the center thereof, a pair of bars 42-1 and 42-2, and another pair of bars 43-1 and 43-2. Vernier 41 and bars 42-1, 42-2, 43-1 and 43-2 are made transparent, for example, thereby allowing light beam to pass therethrough. Namely, bars 42-1 and 43-1 define a first light passing section while bars 42-2 and 43-2 define a second light passing section. The other portion of reticle mark 37 is chrome-coated not to reflect but to absorb light beam.

Reticle mark 37 has reference axial line 44. Vernier 41 is formed symmetrical along reference axial line 44. Vernier 41 has wide portion 45 and step-like portion 46. Step-like portion 46 consists of part 46-1 smallest in width, part 46-3 largest in width, and part 46-2 medium in width.

Bar 42-1 is located along reference axial line 44 and symmetrical in relation to bar 42-2. Same thing can be said about bars 43-1 and 43-2. Bars 42-1, 42-2, 43-1 and 43-2 are equal in width and their width is denoted by e. Their length is equal and denoted by f. Bar 42-1 has axial center line 47. The distance from axial center line 47 of bar 42-1 to reference axial line 44 is denoted by g.

Figure 7B:
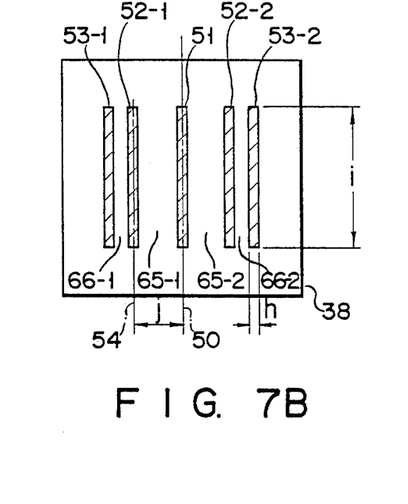
FIG. 7B is a plan showing a reference mark according to the present invention.

As shown in FIG. 7B, reference mark 38 has reference axial line 50. It further has bar 51 on reference axial line 50, a pair of bars 52-1, 52-2 and another pair of bars 53-1, 53-2. Bar 51 and bars 52-1, 52-2, 53-1, 53-2 do not reflect but absorb light beams. Namely, bars 52-1 and 53-1 define a first light absorbing section. Bars 52-2 and 53-2 define a second light absorbing section. The other portion of reference mark 38 is formed as a mirror capable of reflecting light. First light reflecting section 65-1, 66-1 is defined between bars 51 and 52-1 and between bars 52-1 and 53-1. Second light reflecting section 65-2, 66-2 is defined between bars 51 and 53-2 and between bars 52-2 and 53-2. Bar 52-1 is located along reference axial line 50 and symmetrical in relation to bar 52-2. Same thing can be said about bars 53-1 and 53-2. The width of all bars 52-1, 52-2, 53-1 and 53-2 is equal and denoted by h. Their length is equal and represented by i. Bar 52-1 has axial center line 54. The distance between axial center line 54 of bar 52-1 and reference line 50 is represented by j.

Light beam reflected by reference mark 38 is introduced to the reticle mark through projecting lens 32 in the course of the alignment. The image of reference mark 38 is thus magnified n times (n denotes the magnification of the lens) and projected on reticle mark 37. In the case of this embodiment according to the present invention, the size of the image of reference mark 38 is made equal to that of reticle mark 37. Further, the width of the image of bar 51 is made substantially equal to that of portion 46-1 which is the narrowest of vernier 41. The image of each of bars 52-1, 52-2, 53-1 and 53-2 is made equal in size to that of each of bars 42-1, 42-2, 43-1 and 43-2. Namely, $$e = n \cdot h \quad (1)$$

$$f = n \cdot i \quad (2)$$

Figure 8:
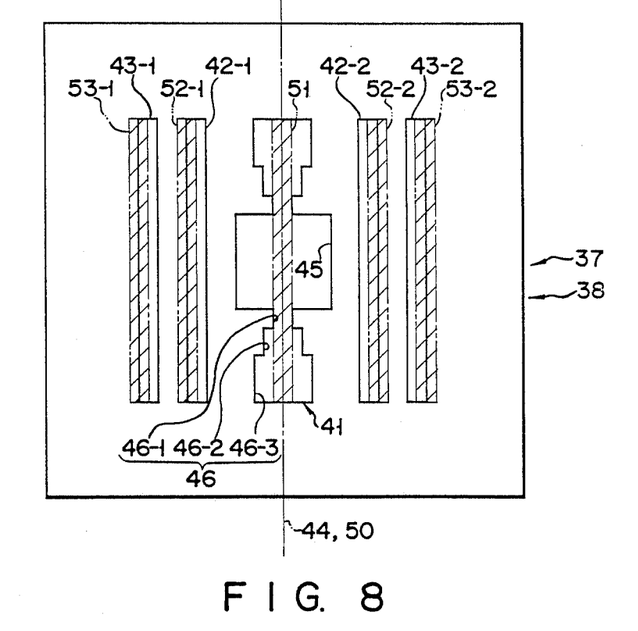
FIG. 8 shows the reticle mark overlapped upon the reference mark.

When the reticle and the wafer table are aligned relative to each other, reference axial line 44 is placed upon reference axial line 50, as shown in FIG. 8. The distance (on image (n·j)) between reference axial line 50 and axial center line 54 is made longer only by the half of the width of a bar than the distance (g) between reference axial line 44 and axial center line 47. Namely, $$n \cdot j = g + (\tfrac{1}{2})e \quad (3)$$

The image of each of bars 52-1, 52-2, 53-1 and 53-2 is put upon that of each of bars 42-1, 42-2, 43-1 and 43-2 at the half area thereof.

The rough alignment between reticle 31 and wafer table 33 will be described.

Vernier 41 of reticle mark 37 and bar 51 of reference mark 38 are used for this rough alignment. As shown in FIG. 6, the aligning device has half mirror 61, group of lenses 62, half mirror 63 and ITV camera 64. The image of bar 51 on reference mark 38 is projected on vernier 41 of reticle mark 37 through projecting lens 32. The image of bar 51 and that of vernier 41 are projected on ITV camera 64 via half mirror 61, group of lenses 62 and half mirror 63. As the result, these images are seen through ITV camera 64 to be piled one upon the other, as shown in FIG. 8. In the case of the rough alignment, therefore, the position of the wafer table is adjusted relative to the reticle in such a way that bar 51 is positioned in widest area 45 of vernier 41. The position of the wafer table is then adjusted in such a way that bar 51 is positioned in step-like area of vernier 41. When the position of the wafer table is further adjusted in such a way that bar 51 is put on narrowest part 46-1 of step-like area 46, the rough alignment between the reticle and the wafer table is finished.

The fine alignment between the reticle and the wafer table will be described below.

Figure 9:
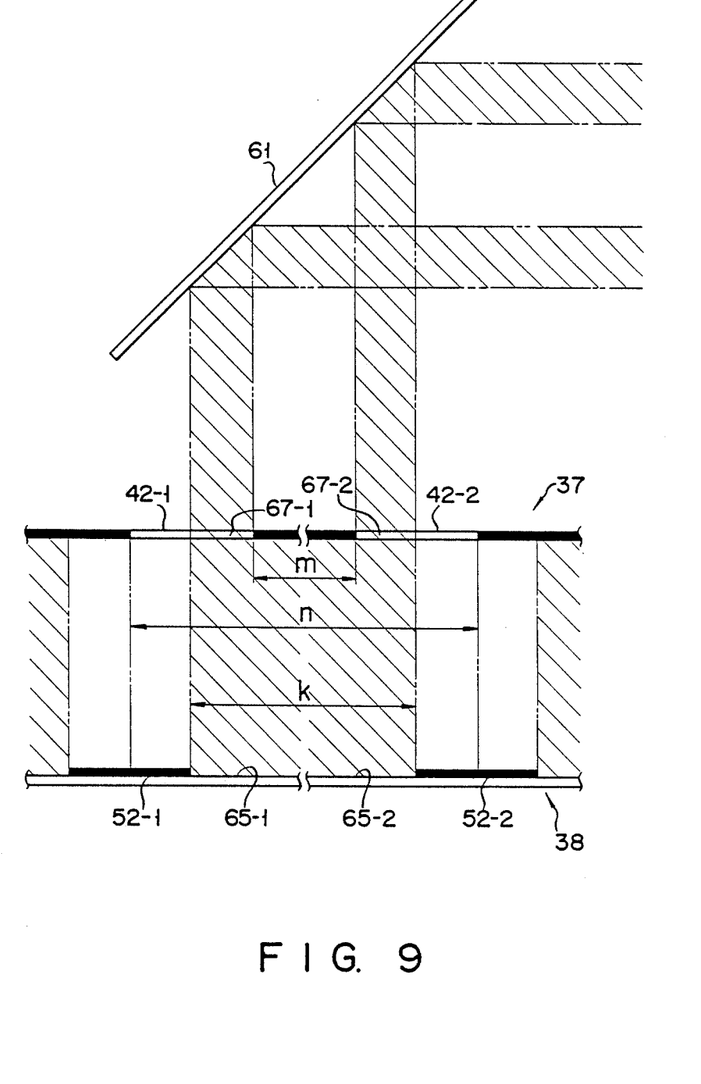
FIG. 9 shows a case where the alignment is carried out and FIG. 10 shows a case where no alignment is carried out.
Figure 10:
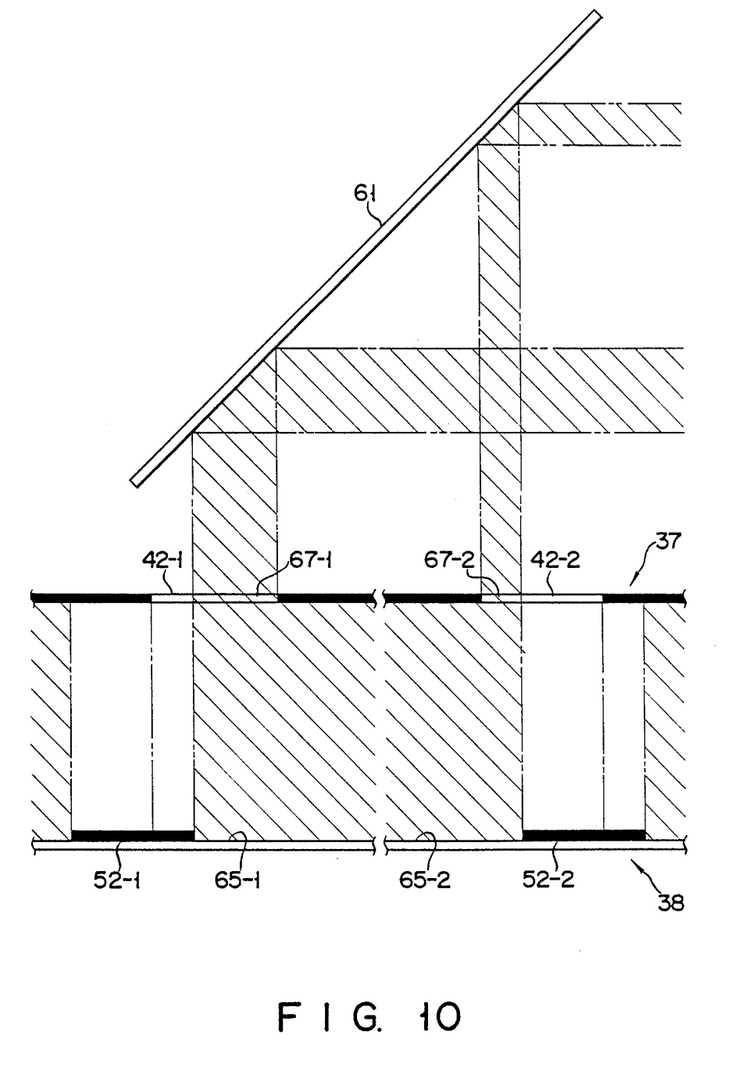

For the simplicity of explanation, FIGS. 9 and 10 show reticle and reference marks 37 and 38 sectioned. It is supposed in FIGS. 9 and 10 that the reticle and reference marks are opposed to each other with the projecting lens omitted. Further, FIG. 9 shows a case where the reticle and the wafer table are aligned relative to each other, and FIG. 10 shows a case where the reticle and the wafer table are shifted from each other by a certain distance. Furthermore, a pair of bars 42-1, 42-2 and another pair of bars 52-1, 52-2 are employed in the course of the alignment shown in FIGS. 9 and 10, but the same alignment can be achieved using a pair of bars 43-1, 43-2 and another pair of bars 53-1, 53-2.

Laser beam emitted from laser 36 is irradiated on reference mark 38, passing through bars 42-1 and 42-2 of reticle mark 37 and projecting lens 32. A part of light beam is absorbed by bars (or first and second light absorbing sections) 52-1 and 52-2 and other part of the light beam reflected by first and second light reflecting sections 65-1 and 65-2. This reflected light beam is transferred on reticle mark 37. Namely, those areas which is hatched in FIGS. 9 and 10 represent optical paths of the reflected light beam. Images of first and second light reflecting sections 65-1 and 65-2 are thus projected on reticle mark 37. As the result, there is defined first overlapping region 67-1 where a part of the image of first light reflecting section 65-1 overlaps bar (or first light passing section) 42-1. Similarly, there is defined second overlapping region 67-2 where a part of the image of second light reflecting section 65-2 overlaps bar (or second light passing section) 42-2. As hatched in FIGS. 9 and 10, the reflected light beam is passed through first and second overlapping regions 67-1 and 67-2 and then transferred on the detector means.

When the reticle and the wafer table are finally aligned relative to each other, the half of the image of each of bars 52-1 and 52-2 is put on that of the image of each of bars 42-1 and 42-2. When the alignment is finished, therefore, the area of first overlapping region 67-1 is half the area of bar (or first light passing section) 42-1. Similarly, the area of second overlapping region 67-2 is also one half of the area of bar (or second light passing section) 42-2. As shown in FIG. 9, therefore, the area of first overlapping region 67-1 is made equal to that of second overlapping region 67-2 at the time when the alignment is finished. The amount of light beam passed through first overlapping region 67-1 is therefore equal to that of light beam passed through second overlapping region 67-2.

When the wafer table is shifted from the reticle by a certain distance in position, as shown in FIG. 10, the area of first overlapping region 67-1 is increased proportional to this positional shift while the area of second overlapping region 67-2 is decreased proportional to the positional shift. Namely, the difference of area between first and second overlapping regions is proportional to the positional shift. Therefore, the difference of amounts of light beam passed through first and second overlapping regions is proportional to the positional shift.

As apparent from the above, the position of the wafer table may be adjusted relative to the reticle in such a way that the amount of light passed through one overlapping region becomes equal to the amount of light passed through the other overlapping region. In other words, the position of the wafer table may be adjusted relative to the reticle in such a way that the difference in amount between the two light beams becomes zero.

According to the above-described embodiment of the present invention, the area of first overlapping region (or second overlapping region) is half the area of bar 42-1 (or bar 42-2), when the alignment is finished. More specifically, the image of each of bars 52-1 and 52-2 overlaps each of bars 42-1 and 42-2 at the half of its region when the reticle and the wafer table are finally aligned relative to each other. Test results show that the alignment can be achieved with the highest accuracy in the case of this embodiment.

However, it is not necessary that the area of first overlapping region (or second overlapping region) is half the area of bar 42-1 (or bar 42-2), when the alignment is finished. The area of first overlapping region (or second overlapping region) can be, for example, a quarter or three quarter of the area of bar 42-1 (or bar 42-2), when the alignment is finished. That is, it is not necessary that the image of each of bars 52-1 and 52-2 overlaps each of bars 42-1 and 42-2 at the half of its region, when the alignment is finished. At least a portion of the image of each bars 52-1 and 52-2 can overlap each of bars 42-1 and 42-2. Thus, as shown in FIG. 9, a distance k between inner sides of images of bar 52-1 and 52-2 can be longer than a distance m between inner sides of bars 42-1 and 42-2, and shorter than a distance n between outer sides thereof.

Figure 11:
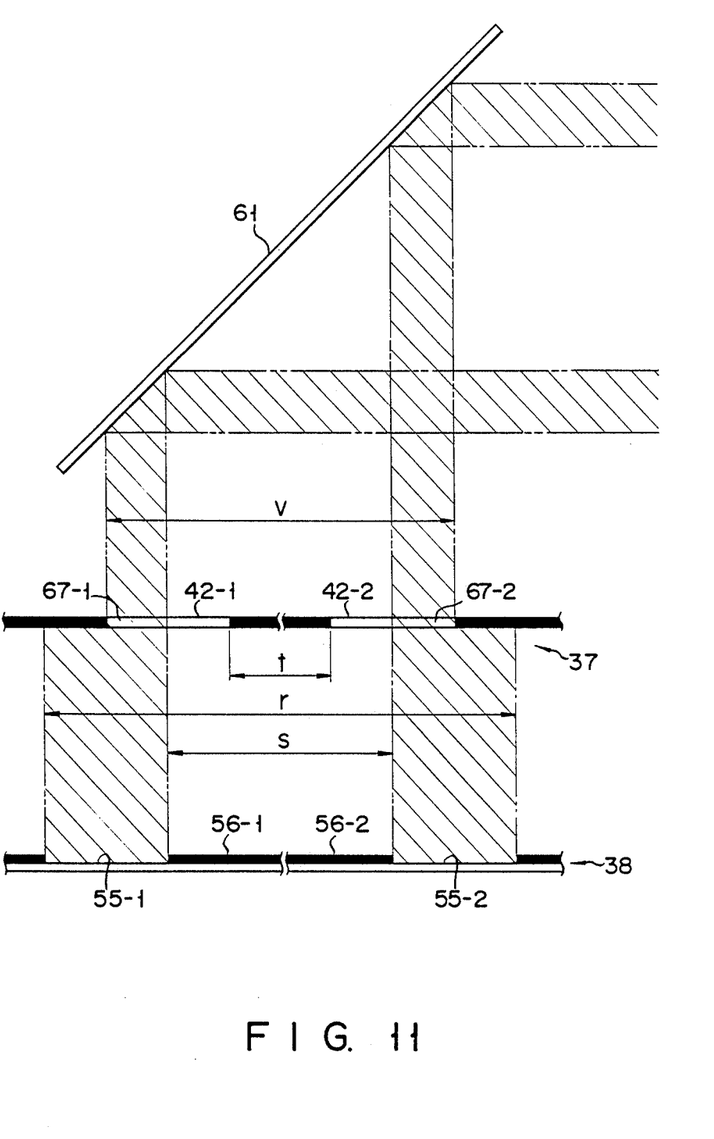
FIG. 11 is a sectional view showing reticle and reference marks (with the projector lens omitted) according to a variation of the present invention.

FIG. 11 shows a reticle mark and a reference mark according to a variation of the present invention.

Reference mark 38 on the wafer table has light reflecting bars 55-1 and 55-2. The other portion of reference mark 38 is made to absorb light. Namely, bars 55-1 and 55-2 define first and second light reflecting sections and the other portion defines first and second light absorbing sections 56-1 and 56-2. Light beam reflected by bar (or first light reflecting section) 55-1 passes through first light passing region 67-1 in this case, too. Similarly, light beam reflected by bar (or second light reflecting section) 55-2 passes through second light passing region 67-2. The reticle and the wafer table are aligned relative to each other in such a way that amounts of the two light beams become equal.

In this variation, it is not necessary that the image of each of bars 55-1 and 55-2 overlaps each of bars 42-1 and 42-2 at the half of its region, when the alignment is finished. At least a portion of the image of each bars 55-1 and 55-2 can overlap each of bars 42-1 and 42-2. Thus, as is shown in FIG. 11, a distance r between outer sides of images of bars 55-1 and 55-2 can be longer than a distance t between inner sides of bars 42-1 and 42-2, and a distance s between inner sides of images of bars 52-1 and 52-2 can be shorter than a distance v between outer sides of bars 42-1 and 42-2.

The detector means and the position adjusting means will be now described as is shown in FIG. 6.

The detector means detects reflected light beam (which will be hereinafter referred to as first light beam) passed through first overlapping region. It also detects reflected light beam (which will be hereinafter referred to as second light beam) passed through second overlapping region. It includes therefore a synchronous detector means for detecting first and second light beams synchronously. More specifically, it includes photo-sensor 71, synchronous detector 72, vibration mirror 73, vibrator 74, oscillator 75 and aperture 76. Reference signal having a certain frequency is emitted from oscillator 75 and supplied to vibrator 74 and synchronous detector 72. Vibration mirror 73 is thus vibrated at the certain frequency. Therefore, first and second light beams are alternately directed in two directions every time when a certain time period passes by. One of the light beams is thus stopped from passing through aperture 76 while the other is allowed to pass through aperture 76 every time when the certain time period passes by. As the result, the first and second light beams are alternately converted to two detecting signals every certain time period. These two detecting signals are alternately applied to synchronous detector 72 through amplifier 77 every certain time period. Synchronous detector 72 detects the two detecting signals synchronously, basing on the reference signal which has the certain frequency. Amounts (strength×time) of the first and second light beams are thus detected and their difference is operated. This difference of the two is proportional to the positional shift.

The position adjusting means has signal processing circuit 80, motor drive circuit 81 and motor 35. The difference of amounts of the first and second light beams is supplied to signal processing circuit 80, which emits a motor drive signal in such a manner that this difference becomes zero. This motor drive signal is supplied to motor drive circuit 81. Predetermined current is supplied from motor drive circuit 81 to motor 35. The position of the wafer table is thus adjusted relative to the reticle. The reticle and the wafer table are aligned relative to each other in such a way that the difference of amounts of the first and second light beams become zero.

The present invention can achieve three main effects, as described below.

The first effect is that the reticle and the wafer can be directly aligned relative to each other. In the case of the conventional aligning method shown in FIGS. 1 through 3, reference mark 11 on wafer table 3 is matched relative to reference line 19 of optical system 12 and reticle mark 8 is then matched relative to reference line 19, so that the wafer table and the reticle can be aligned relative to each other. Therefore, the conventional method includes two processes. The alignment becomes complicated accordingly. Since the alignment is carried out through two processes, the reticle and the wafer table must be moved in the course of the alignment. The conventional method is therefore more likely to cause errors in the alignment. According to the present invention, however, the reticle and the wafer table can be aligned relative to each other through one process. The aligning process becomes easier accordingly. In addition, it is not needed that both the reticle and the wafer table are moved in the course of the alignment. Therefore, error is difficultly caused and the accuracy of aligning the reticle and the wafer table can be enhanced.

On the second effect, there is no need that drifting of a reference line is considered, so that amounts (strength×time) of light beams can be detected. In the case of the conventional method shown in FIGS. 3 and 4, vibration slit 14 vibrates, taking reference line 19 as its vibrating center. The distance between the image of bar projected on vibration slit 14 and reference line 19 is thus detected. According to the conventional method, therefore, it is needed that the position of reference line 19 is not drifted. However, the position of reference line 19 is often drifted because of change in voltage. This makes it impossible to accurately measure the distance between the image of bar and reference line 19. As the result, the conventional method is more likely to cause errors in the alignment. According to the present invention, however, the amount of the first light beam is made equal to that of the second light beam so that the reticle and the wafer table can be aligned relative to each other. It is therefore sufficient in the case of the present invention that amounts of the two light beams are detected. This makes it unnecessary to use the vibration slit. As the result, it cannot happen that the reference line is drifted. The present invention thus allows the alignment to be carried out with high accuracy.

Figure 12:
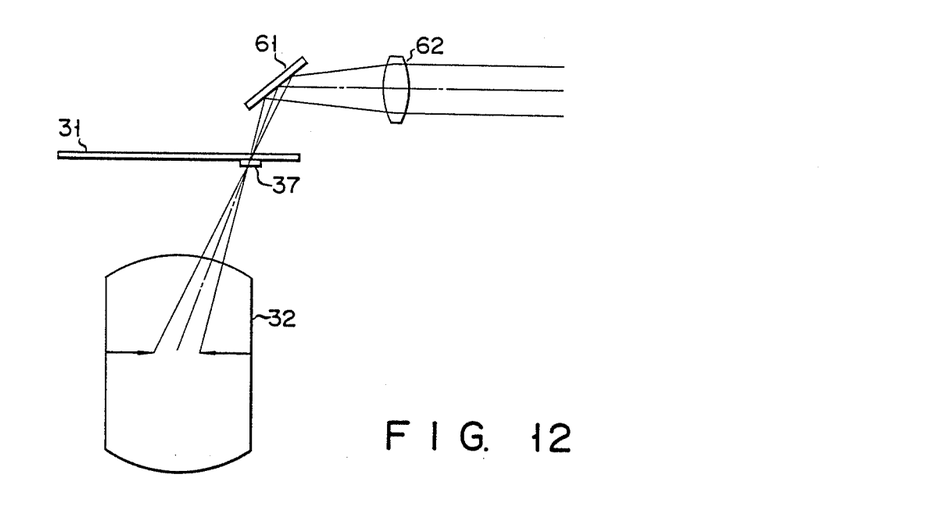
FIG. 12 shows the projector lens, reticle, mirror and lens in FIG. 6.

The third effect will be described referring to FIG. 12.

It is needed in the case of the conventional method that reference line 19 is the center line for the lenses and that reference line 19 is arranged vertical to reticle mark 14. In the case where lenses 16 are single-sided telecentric. Therefore, luminous flux passed through reticle mark 8 passes through the upper halves of lenses 16, as shown in FIG. 4. In the case of the conventional method, therefore, lenses 16 and mirror 17 are sometimes made large in size. Optical system 12 is thus large-sized. In addition, the aberration of lenses 16 are sometimes corrected in the case of the conventional method so as to allow the luminous flux to pass through the whole of lenses 16. This makes the arrangement of the lenses complicated.

In contrast, only the amounts of the two light beams may be detected in the case of the present invention, as described above. Therefore, the light beams passed through the reticle mark may be passed through the whole of lens 62, as shown in FIG. 12. In addition, the present invention makes it unnecessary to use the vibration slit and it is not needed that the reference line is arranged vertical to the reticle mark. The lens and the mirror can be thus small-sized. Further, the arrangement of the lens can be simplified because it is not needed that the aberration of the lens is corrected.

Conventionally, the arrangement of the lens is limited. It is therefore limited where the reticle mark is positioned on the reticle. When the size of the circuit pattern is small, therefore, the distance between the circuit pattern and the reticle mark becomes comparatively long. As the result, the aligning accuracy is sometimes lowered. In contrast, only the amounts of the light beams may be detected in the present invention, thereby making it possible that the arrangement of the lens group is not limited. The reticle mark can be thus positioned anywhere on the reticle. The aligning accuracy can be enhanced accordingly.

A pair of bars 42-1, 42-2 of reticle mark 37 and another pair of bars 52-1, 52-2 of reference mark 38 are used for the alignment shown in FIGS. 9 through 11. In the case of the present invention, however, plural pairs of bars of the reticle mark and plural pairs of bars of the reference mark may be used for the alignment. The signal-to-noise ratio becomes high in this case. The alignment can be thus carried out with higher accuracy.

Further, this embodiment of the present invention is of the TTL type wherein the detecting light beams (or first and second light beams) are passed through the projecting lens. The alignment can be therefore carried out with high accuracy. Further, the detecting light beams are not transferred to the exposing face of the reticle. It is therefore preferable that the light beams have a wavelength same as that of the exposing light which is used when the circuit pattern is projected. This is because the focus of the light beams passed through the projecting lens is sometimes shifted from the predetermined position when light having a wavelength different from that of the exposing light is used.

Figure 13:
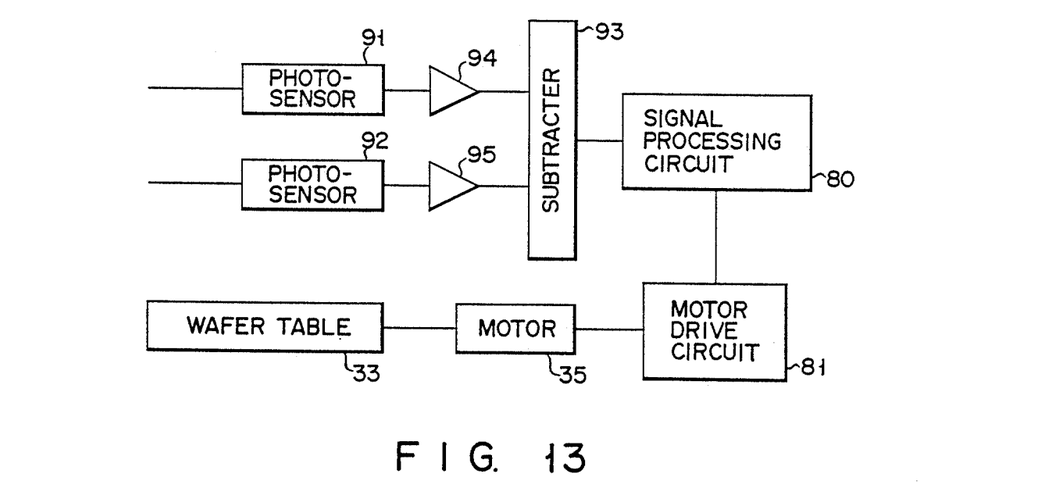
FIG. 13 is a block diagram showing a detector means and a position adjusting means according to a variation of the present invention.

FIG. 13 shows variations of the detector and position adjusting means.

The detector means shown in FIG. 13 includes two photo-sensors 91 and 92, and the position adjusting means includes subtractor 93. The first and second light beams are detected, independently of each other, by photo-sensors 91 and 92 and converted to two detecting signals. These detecting signals are supplied to subtractor 93 through amplifiers 94 and 95. The difference of the two detecting signals is operated by subtractor 93. Namely, the difference of the first and second light beams is operated. Similarly to the above-described case, the difference of the detecting signals is then supplied to signal processing circuit 80. Only the difference of the first and second light beams may be operated in the present invention.

Figure 14:
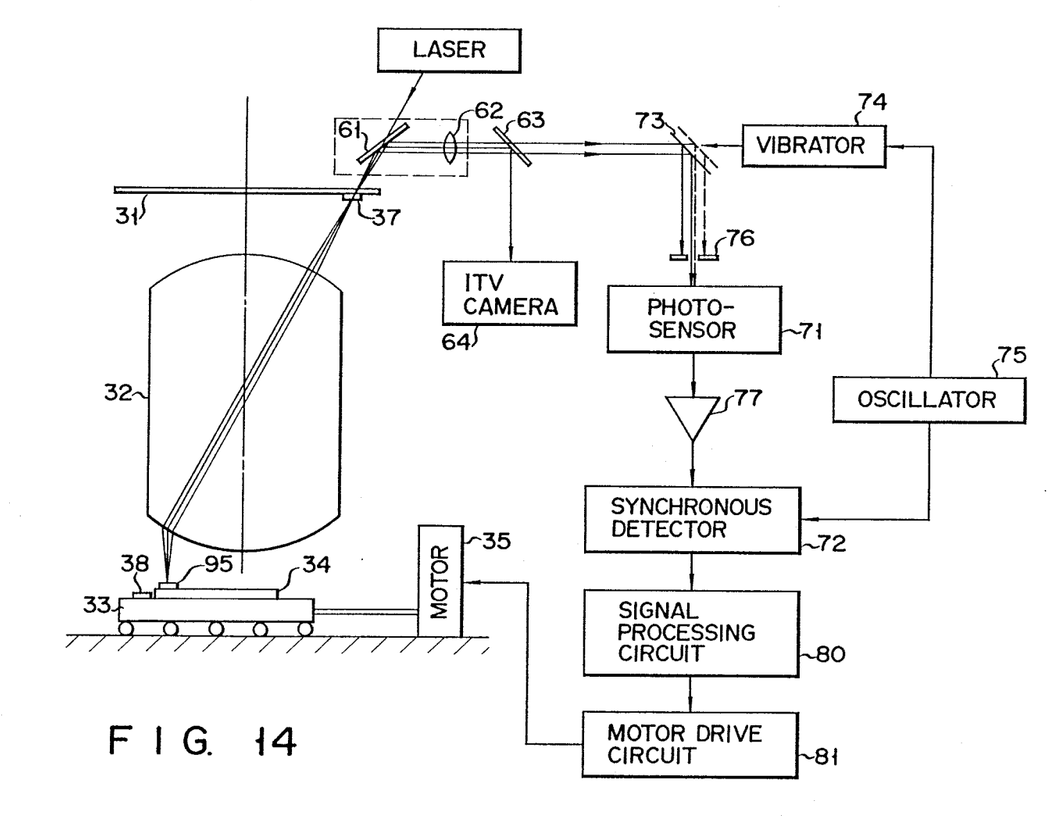
FIG. 14 shows the device for aligning the reticle and the wafer relative to each other according to the present invention.

FIG. 14 shows the second process of aligning the reticle and the wafer relative to each other. Wafer mark 95 quite same as the reference mark is formed on wafer 34. This wafer mark 95 is the same as shown in FIG. 7B. Therefore, the amounts of the first and second light beams reflected by wafer mark 95 and passed through projecting lens 32 and reticle mark 37 are detected in the second process. The position of the wafer is adjusted relative to the reticle so as to make the difference of amounts of the first and second light beams zero. The wafer can be thus aligned relative to the reticle with high accuracy.

As shown in FIG. 5, the wafer is conventionally aligned relative to the reticle, according to the off-axis manner. The detecting light beams are not passed through the projecting lens, and the alignment between the reticle and the wafer cannot be achieved through one process, so that errors can be caused easily. According to the present invention, however, the alignment between the reticle and the wafer can be carried out through one process and the detecting light beams are passed through the projecting lens. The alignment cam be thus made easier and errors are not likely to be caused.

Three kinds of alignment are carried out in the first and second processes. They are in a first direction (or direction x) on the plane of the wafer table, in a direction (or direction y) perpendicular to the first direction on the plane of the wafer table and in a rotating direction on the plane of the wafer table.

The position of the wafer table may be measured by the laser interferometer in a case where the wafer table is moved after the wafer table is aligned relative to the reticle.

What is claimed is:

1. A method of aligning first and second objects relative to each other, which objects are moved relative to and parallel to each other, comprising steps of:
    forming a first mark on the first object, said first mark having first and second light-passing sections;
    forming a second mark on the second object, said second mark having first and second light-reflecting sections;
    directing a light beam, emitted from a light source, onto the first and second light-reflecting sections of the second mark;
    transferring the light beam reflected by the first light-reflecting section onto the first mark, thereby projecting an image of the first light-reflecting section onto the first mark, and said first light-passing section having a first overlapping region which overlaps a part of the image of said first light-reflecting section;
    transferring the light beam reflected by the second light-reflecting section onto the first mark, thereby projecting an image of the second light-reflecting section onto the first mark, and said second light-passing section having a second overlapping region which overlaps a part of the image of the second light-reflecting section;
    detecting a first light beam passed through the first overlapping region and a second light beam passed through the second overlapping region independently of each other, the difference in amount between these two light beams being proportional to the positional shift between the first and the second object; and
    adjusting the first and second objects relative to each other in such a way that the first and second light beams become equal in amount, so that the first and second objects can be aligned relative to each other.

2. The method according to claim 1, wherein said first object is a reticle and said second object is a wafer table or wafer in the projecting and exposing apparatus.

3. The method according to claim 2, wherein a projecting lens is arranged between the reticle and the wafer, a light beam emitted from a light source is transferred onto the second mark through the projecting lens, and the light beam reflected by the first and second light-reflecting sections of the second mark is transferred onto the first mark through the projecting lens.

4. The method according to claim 1, wherein said first mark includes a pair of light-passing bars each having inner and outer sides and separated from each other on the first object, to serve as the first and second light-passing sections, and said second mark includes a pair of light-absorbing bars each having inner sides and separated from each other on the second object, and a light-reflecting region located between the paired light-absorbing bars, to serve as the first and second light-reflecting sections, so that the distance between the inner sides of images of the paired light-absorbing bars of said second mark, transferred onto the first object, is longer than that between the inner sides of the paired light-passing bars of said first mark and shorter than that between the outer sides thereof.

5. The method according to claim 1, wherein said first mark includes a pair of light-passing bars each having inner and outer sides and separated from each other on the first object, to serve as the first and second light-passing sections, and said second mark includes a pair of light-reflecting bars each having inner and outer sides and located on the second object, to serve as the first and second light-reflecting sections, so that the distance between the outer sides of images of the paired light-reflecting bars of said second mark, transferred onto the first object, is longer than that between the inner sides of the paired light-passing bars of said first mark, and the distance between the inner sides of images of the paired light-reflecting bars of said second mark, transferred onto the first object, is shorter than that between the outer sides of the paired light-passing bars of said first mark.

6. The method according to claim 1, wherein said adjusting step includes a step for operating the difference in amount between the first and second light beams, and adjusting the relative position of the first and second objects to make the difference zero.

7. The method according to claim 6, wherein said detecting step has a course during which the first and second light beams are alternately detected every predetermined time period.

8. The method according to claim 3, wherein light emitted from the light source is same as the exposing light used to project circuit patterns or has a wavelength equal to that of said exposing light.

9. The method according to claim 3, wherein said first mark has a vernier and said second mark has a light-absorbing bar, and said vernier and bar are used to roughly align the reticle and the wafer or wafer table.

10. The method according to claim 3, wherein after the reticle and the wafer table are aligned relative to each other, the position of the wafer table is measured by the laser interferometer.

11. A device for aligning first and second objects which are moved relative to and parallel to each other, comprising
a first mark formed on the first object and having first and second light-passing sections;
a second mark formed on the second object and having first and second light-reflecting sections;
a light source for emitting a light beam, said light beam being directed to and reflected by the first and second light-reflecting sections of said second mark and transferred onto said first mark, an image of said first light-reflecting section being projected onto the first mark, so that the first light-passing section has a first overlapping region which overlaps a part of the image of said first light-reflecting section, an image of said second light-reflecting section being projected onto the first mark, so that said second light-passing section has a second overlapping region which overlaps a part of the image of said second light-reflecting section;
a means for detecting a first light beam passed through the first overlapping region and a second light beam passed through the second overlapping region independently of each other, the difference in amount between these two light beams being proportional to the positional shift between the first and the second object; and
a means for adjusting the first and second objects relative to each other, to make the first and second light beams equal in amount, so that the first and second objects can be aligned relative to each other.

12. The device according to claim 11, wherein said first object is a reticle and said second object is a wafer or wafer table in the projecting and exposing apparatus.

13. The device according to claim 12, wherein a projecting lens is located between the reticle and the wafer, light emitted from the light source is transferred onto the second mark through the projecting lens, and the light reflected by the first and second light-reflecting sections of the second mark is transferred to the first mark through the projecting lens.

14. The device according to claim 11, wherein said first mark includes a pair of light-passing bars each having inner and outer sides, to serve as the first and second light-passing sections, and said second mark includes a pair of light-absorbing bars each having inner sides, and a light-reflecting region located between the paired light-absorbing bars, to serve as the first and second light-reflecting sections, so that the distance between the inner sides of images of the paired light-absorbing bars of said second mark, transferred onto the first object, is longer than that between the inner sides of the paired light-passing bars of said first mark and shorter than that between the outer sides thereof.

15. The device according to claim 11, wherein said first mark includes a pair of light-passing bars each having inner and outer sides, to serve as the first and second light-passing sections, and said second mark includes a pair of light-reflecting bars each having inner and outer sides, to serve as the first and second light-reflecting sections, so that the distance between the outer sides of images of the paired light-reflecting bars of said second mark, transferred onto the first object, is longer than that between the inner sides of the paired light-passing bars of said first mark, and the distance between the inner sides of images of the paired light-reflecting bars of said second mark, transferred onto the first object, is shorter than that between the outer sides of the paired light-passing bars of said first mark.

16. The device according to claim 11, wherein said adjusting means includes an operational means for operating the difference in amount between the first and the second light beam, and an adjusting means for adjusting the first and second objects in position, so as to make the difference zero.

17. The device according to claim 16, wherein said detecting means has a means for detecting the first and second light beams alternately every predetermined time period.

18. The device according to claim 13, wherein the light emitted from the light source is same as the exposing light used to project circuit patterns or has a wavelength equal to that of the exposing light.

19. The device according to claim 13, wherein said first mark has a vernier and said second mark has a light-absorbing bar, and said vernier and light-absorbing bar are used to roughly align the reticle and the wafer or wafer table relative to each other.

* * * * *